(12) United States Patent
Straeussnigg et al.

(10) Patent No.: US 11,582,560 B2
(45) Date of Patent: Feb. 14, 2023

(54) DIGITAL MICROPHONE WITH LOW DATA RATE INTERFACE

(71) Applicant: Infineon Technologies AG, Neubiberg (DE)

(72) Inventors: Dietmar Straeussnigg, Villach (AT); Luis Hernandez, Madrid (ES); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 212 days.

(21) Appl. No.: 17/106,983

(22) Filed: Nov. 30, 2020

(65) Prior Publication Data

US 2022/0174424 A1    Jun. 2, 2022

(51) Int. Cl.
*H04R 19/00*  (2006.01)
*H04R 19/04*  (2006.01)
*B81B 3/00*  (2006.01)
*H04R 1/02*  (2006.01)

(52) U.S. Cl.
CPC ........... *H04R 19/04* (2013.01); *B81B 3/0021* (2013.01); *H04R 1/02* (2013.01); *B81B 2201/0257* (2013.01); *H04R 2201/003* (2013.01)

(58) Field of Classification Search
CPC .... H04R 19/04; H04R 1/02; H04R 2201/003; H04R 19/005; H04R 1/083; B81B 3/0021; B81B 2201/0257
See application file for complete search history.

(56) References Cited

U.S. PATENT DOCUMENTS

| | | | |
|---|---|---|---|
| 9,542,933 B2 * | 1/2017 | Mortensen | G10L 15/10 |
| 2018/0005636 A1 * | 1/2018 | Lesso | G10L 15/00 |

OTHER PUBLICATIONS

Gutierrez, E., et al., "VCO-based Feature Extraction Architecture for Low Power Speech Recognition Applications," IEEE 62nd International Midwest Symposium on Circuits and Systems (MWSCAS), Dallas, TX, USA, Aug. 4-7, 2019, pp. 1175-1178, doi: 10.1109/MWSCAS.2019.8885088.

Gutierrez, Eric et al., "Time-Encoding-Based Ultra-Low Power Features Extraction Circuit for Speech Recognition Tasks", Department of Electronics Technology, Carlos III University of Madrid, 28911 Leganes, Spain MDPI Electronics 2020, 9(3), 418; Available online: https://doi.org/10.3390/electronics9030418, Feb. 29, 2020, 12 pages.

(Continued)

*Primary Examiner* — Matthew A Eason
(74) *Attorney, Agent, or Firm* — Slater Matsil, LLP

(57) ABSTRACT

A MicroElectroMechanical System (MEMS) includes a MEMS device; a feature extraction component coupled to an output of the MEMS device, wherein the feature extraction component is configured to provide a plurality of features of an output signal of the MEMS device; and a low data rate interface coupled to the feature extraction components, wherein the low data rate interface is configured to transmit the plurality of features of the output signal of the MEMS device, and wherein a low data rate of the low data rate interface is determined by a number of the plurality of features transmitted, wherein the MEMS device, the feature extraction component, and the low data rate interface are packaged together in a semiconductor package.

20 Claims, 13 Drawing Sheets

(56) References Cited

OTHER PUBLICATIONS

Infineon Technologies Austria AG, "Time Encoded Voice Interfaces", Horizon 2020, Fact Sheet, https://cordis.europa.eu/project/id/956601, Coordinator Universidad Cados III De Madrid, Jul. 10, 2020, Record No. 230338, 4 pages.

Ruiz, Fernando Hernandez, "Master Univerisario en Ingenieria de Sistemas Electronicos y Aplicaciones", Trabajo Fin de Master, uc3m Universidad Carlos III de Madrid, Sep. 2018-2019, 83 pages, English Abstract Only.

* cited by examiner

| type | Interface clock / bit | Data at interface |
|---|---|---|
| PDM | 768 kHz / 1bit | 768 kbit/s |
| PCM | 16 kHz / 16 bit | 256 kbit/s |
| Case 1 (40 features) | 100 Hz / 16 bit | 64 kbit/s |
| Case 2 (20 features) | 50 Hz / 16 bit | 16 kbit/s |

FIG. 9

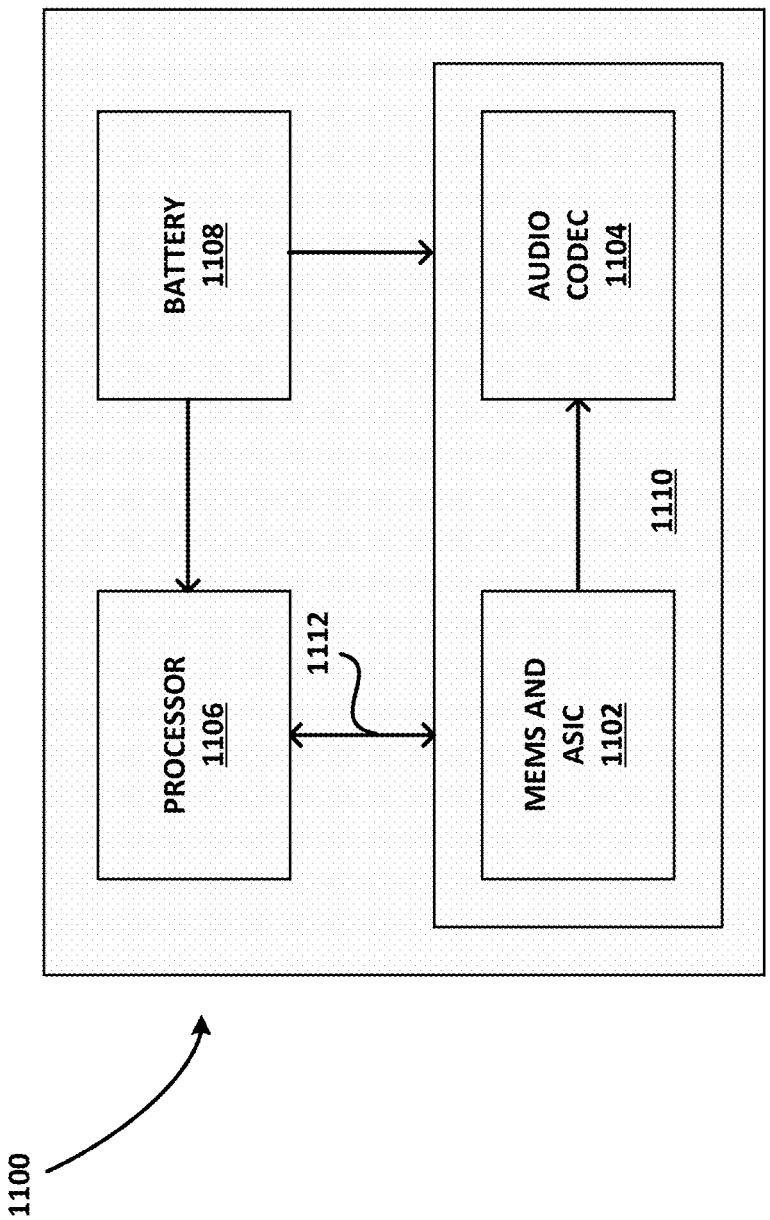

DIGITAL MICROPHONE WITH LOW DATA RATE INTERFACE

TECHNICAL FIELD

The present invention relates generally to a digital microphone with a low data rate interface and to a corresponding method.

BACKGROUND

Digital microphones are used convert audio input signals into corresponding digital output signals. Typical digital microphones include high data rate interfaces including digital signal processing circuitry in order to convert the audio input signals into high quality digital output signals. Due to the always-on nature of the digital microphone and the high power consumption of the digital circuits in the high data rate interface, the use of the digital microphone in portable devices with battery life limitations can be strongly restricted. Manufacturers and customers desire digital microphones with a low data rate interface in order to reduce power and to extend battery life without a significant loss of performance.

SUMMARY

According to an embodiment, A MEMS system includes a MEMS device; a feature extraction component coupled to an output of the MEMS device, wherein the feature extraction component is configured to provide a plurality of features of an output signal of the MEMS device; and a low data rate interface coupled to the feature extraction components, wherein the low data rate interface is configured to transmit the plurality of features of the output signal of the MEMS device, and wherein a low data rate of the low data rate interface is determined by a number of the plurality of features transmitted, wherein the MEMS device, the feature extraction component, and the low data rate interface are packaged together in a semiconductor package.

According to another embodiment, a conversion method includes converting an environmental change into an output signal using a MEMS device; extracting a plurality of features from the output signal of the MEMS device; and transmitting the plurality of features through a low data rate interface, wherein a low data rate of the low data rate interface is determined by a number of the plurality of features transmitted, and wherein the conversion method is practiced by one or more integrated circuits in a single semiconductor package.

According to another embodiment, A MEMS system includes a MEMS microphone; a feature extraction component coupled to an output of the MEMS microphone, wherein the feature extraction component is configured to provide a plurality of features of an output signal of the MEMS microphone; a low data rate interface coupled to the feature extraction component, wherein the low data rate interface is configured to transmit the plurality of features of the output signal of the MEMS device, and wherein a low data rate of the low data rate interface is determined by a number of the plurality of features transmitted; and a codec coupled to the low data rate interface for digitally processing the plurality of transmitted features, wherein the MEMS microphone, the feature extraction component, and the low data rate interface are integrated together on one or more integrated circuits in a single semiconductor package.

BRIEF DESCRIPTION OF THE DRAWINGS

For a more complete understanding of the present invention, and the advantages thereof, reference is now made to the following descriptions taken in conjunction with the accompanying drawings, in which:

FIG. 9 is a table of clock rates and data rates for various microphone interfaces;

FIG. 11 is a block diagram of a digital microphone system, according to an embodiment.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

According to embodiments, a digital microphone system comprises a MEMS device and an Application Specific Integrated Circuit (ASIC) including a feature extraction component and a low data rate interface coupled to the MEMS device. The feature extraction component extracts a plurality of features that highlight the most dominating and discriminating characteristics from the analog output signal of the MEMS devices. In an embodiment, a high quality replica of the analog digital output can be constructed solely from the plurality of features if desired. In other embodiments, the detected features can be used in conjunction with voice recognition applications to initiate or perform various functions. The feature extraction of the feature extraction component can be conducted in the analog or digital domain.

In embodiments, the ASIC is coupled to an external audio coder-decoder (codec) that may include one or more applications that include voice activity detection (VAD), keyword detection (KWD), and voice recognition applications. The low data rate of the low data rate interface is advantageously provided by transmitting only a plurality of features from the feature extraction component through the low rate interface to the codec. Typically, the amount of data associated with the transmitted features is much less than the amount of data associated with a digitally converted analog signal using a high clock rate. Thus, the data rate of the digital microphone system can be reduced.

In some embodiments, the feature extraction is conducted in the analog domain. Thus, an analog-to-digital converter is used to convert the analog features into digital features for subsequent digital signal processing in the digital microphone system. However, the power required to perform the analog-to-digital conversion of the analog features is much lower than the power required to perform a full analog-to-digital conversion of an analog audio signal. The power can be significantly reduced because the clock rate of the analog-to-digital converter can also be significantly reduced. Thus, the digital microphone system according to embodiments can be used in many extremely low power applications. In embodiments, the power requirements of the digital microphone system can be advantageously reduced to less than forty microwatts, preferably less than thirty microwatts, preferably less than twenty microwatts, and preferably less than ten microwatts.

Figure 1A:
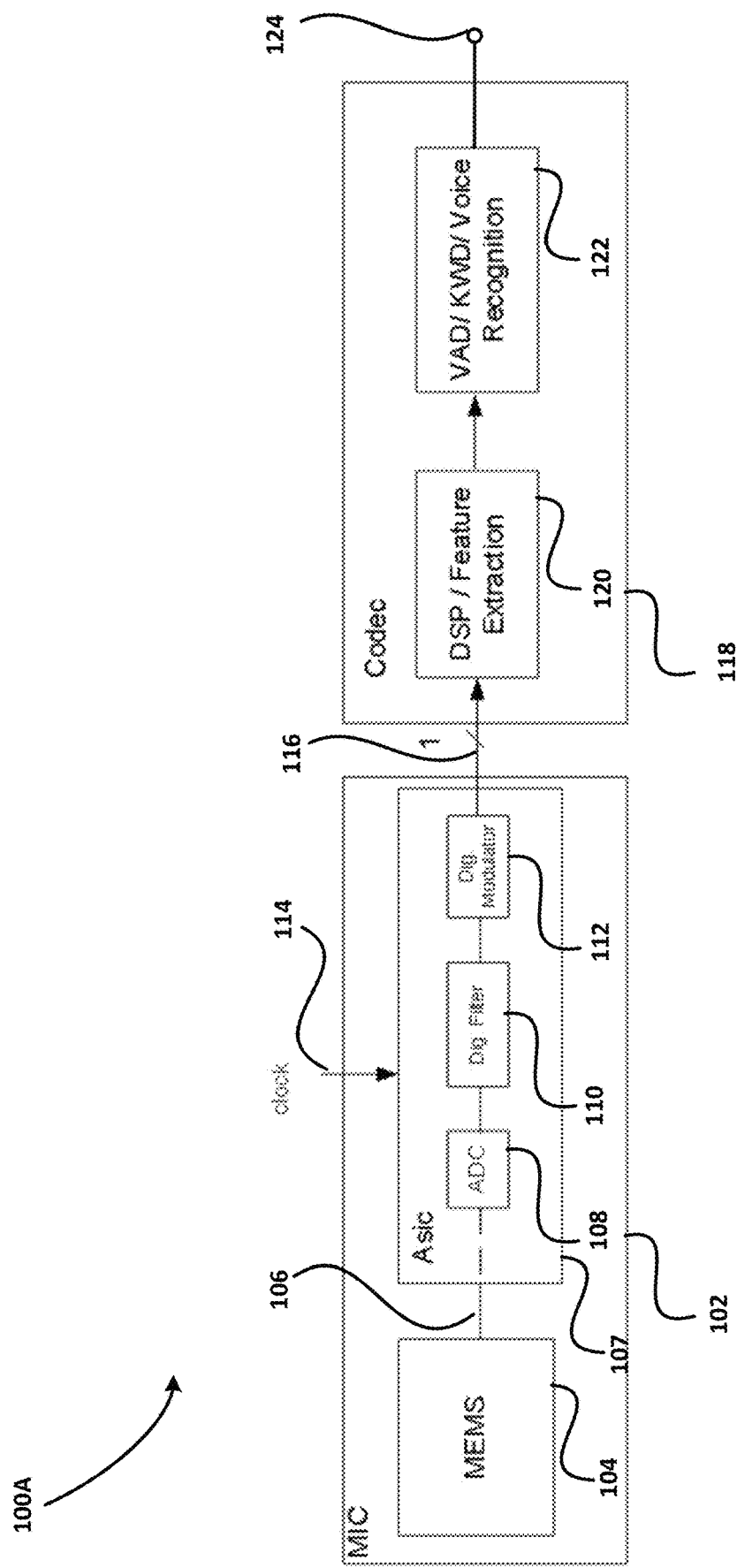
FIG. 1A is a block diagram of an exemplary system partitioning of a digital microphone and a codec including keyword detection, voice activity detection, or voice recognition applications.

FIG. 1A is a block diagram of an exemplary system partitioning of a digital microphone system 100A, particularly configured for standard voice recognition applications. The digital microphone system 100A includes a digital microphone 102 comprising a MEMS component 104 coupled to an input of ASIC 107 through the analog output 106 of the MEMS component 104. The MEMS component 104 can comprise a MEMS microphone component. ASIC 107 includes an analog-to-digital converter (ADC) 108 for converting the analog signal at the analog output 106 into a digital code. The digital code is typically filtered by a digital filter 110 coupled to the output of ADC 108. Finally, ASIC 107 typically includes a digital modulator into a single bit digital stream at the digital microphone output 116. ASIC 107 receives a clock signal at clock input 114 to distribute to one or more of the ASIC components including ADC 108, digital filter 110, and/or digital modulator 112. Microphone system 100A typically includes an audio codec 118 including keyword detection, voice activity detection, or voice recognition applications. A codec output 124 provides a digital signal with output data generated by the keyword detection, voice activity detection, or voice recognition application. In FIG. 1A, the MEMS microphone 104 senses acoustic signals and the ASIC 107 transmits a single bit signal to a processor (not shown in FIG. 1). The single bit signal can be encoded using Pulse Code Modulation (PCM) or Pulse Density Modulation (PDM). Further digital signal processing functionality is performed such as feature extraction in DSP component 120, and the voice activity detection (VAD), keyword detection (KWD) or voice recognition is performed in voice recognition component 122. DSP block 120 has an input coupled to the digital microphone output 116, and voice recognition component 122 has an output coupled to codec output 124.

One aspect of the digital microphone system shown in FIG. 1A is the high power consumption due to the high clock rate used the analog-to-digital conversion performed by ADC 108. A standard digital microphone typically provides a single bit stream at a low data rate (for example 768 kHz in a low power operational mode) or at a high data rate (for example 2.4 to 3 MHz in high performance operational mode). The high performance operational mode leads to high power dissipation in ASIC 107 due to the high clock rate required by ADC 108.

Figure 1B:
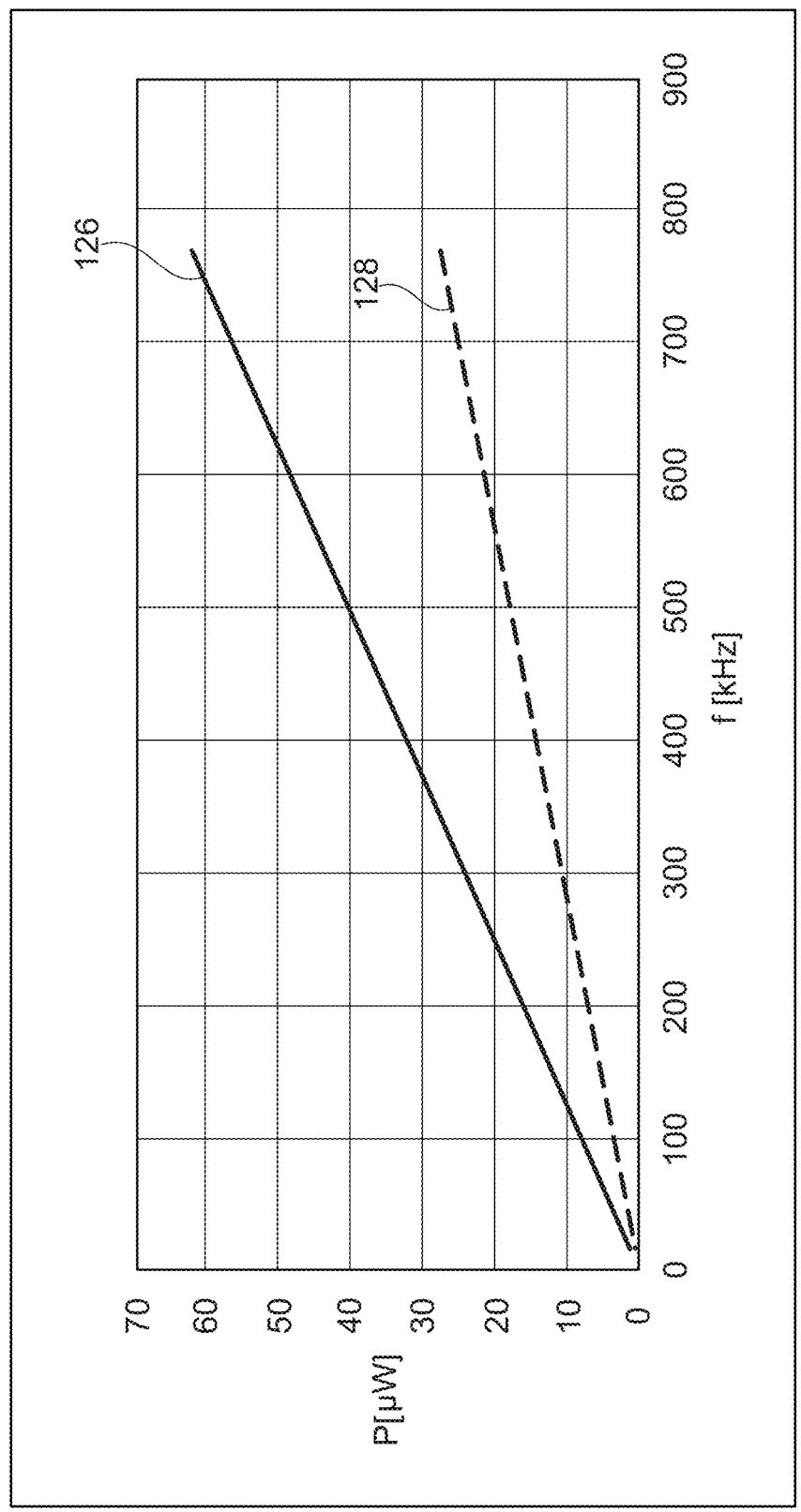
FIG. 1B is a graph of CMOS interface power versus frequency for the digital microphone and codec of FIG. 1A.

FIG. 1B is a graph of CMOS interface power versus frequency for the digital microphone 102 and audio codec 118 of FIG. 1A, wherein "interface power" can be defined as the power required by digital microphone 102 to provide the single bit digital stream at digital microphone output 116, which is the interface to further processing circuitry such as audio codec 118. In FIG. 1B a 50 pF load capacitance is assumed at digital microphone output 116. In state of the art microphones, a power consumption as low as 200 W is achieved but further power reduction is required for some battery powered applications. In FIG. 1B the power dissipation of a CMOS interface is depicted versus activity of the interface for two interface voltages. A first line 126 represents interface power versus clock frequency at an interface power supply voltage of 1.8 volts. A second line 128 represents interface power versus clock frequency at an interface power supply voltage of 1.2 volts. A reasonably-sized load capacitance of 50 pf is assumed. At higher clock frequencies, with a load capacitor of 50 pf, the power needed for data communication is significant compared to the digital microphone power. Both the clock line 114 and the data line at digital microphone output 116 define the high power requirements at higher frequencies. At a 768 kHz clock rate, for example, interface power requirements are 120 W (at 1.8 volts) or 56 pW (at 1.2 volts).

What is desired is to reduce the interface data rate and the clock rate significantly, such that the power consumption for the interface can be reduced to single digit pW numbers, which is less than 10 microwatts.

Figure 2:
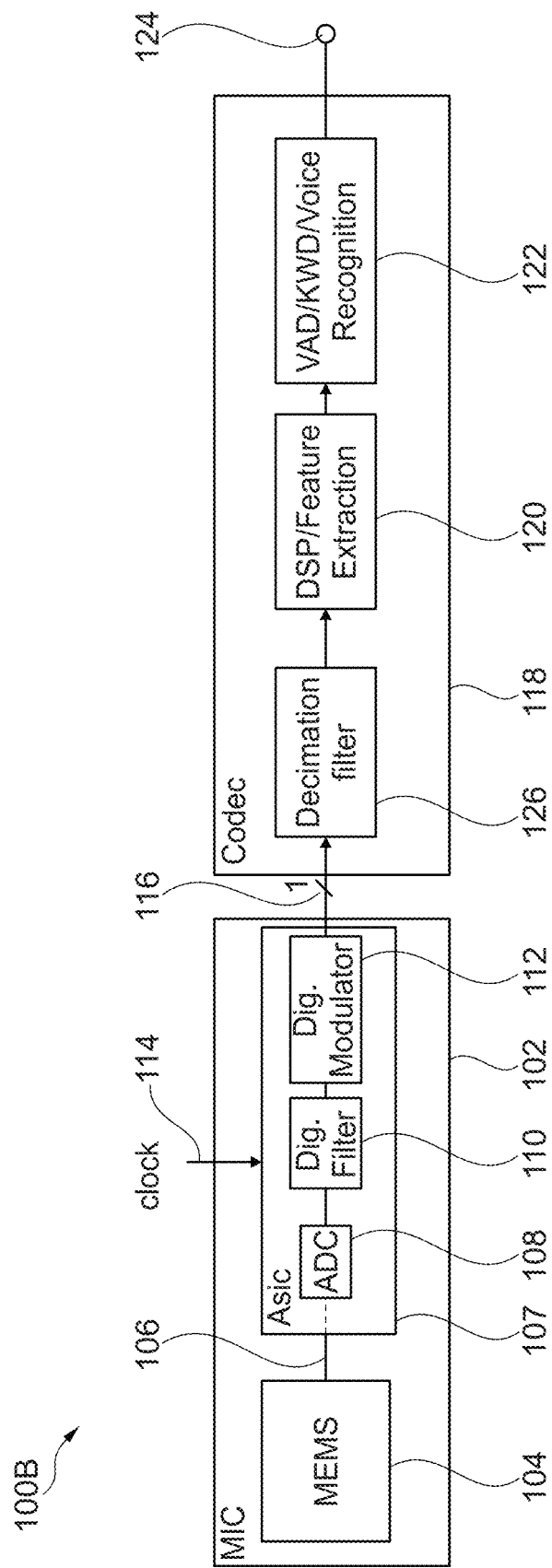
FIG. 2 is a block diagram of an exemplary system partitioning of a digital microphone and a codec including a decimation filter.

FIG. 2 is a block diagram of an exemplary system partitioning of a digital microphone system 100B including digital microphone and audio codec 118. Digital microphone system 100B is similar to previously described digital microphone system 100A, except that audio codec 118 includes a decimation filter 126. In some digital microphone systems include a decimation filter for receiving the single bit digital stream at digital microphone output 116. Decimation filter 126 implements a method of observing only a periodic portion of the ADC samples, while ignoring the rest. The result is to reduce the sample rate of ADC 108. For example, a decimate-by-4 mode would mean that the total samples passing through the decimation filter 126 are reduced by a factor of four, while all of the other samples are effectively discarded. Digital filtering using decimation filter 126 effectively removes the out-of-band noise from the narrowly defined bandwidth that is set by the decimation ratio. An additional aspect of the digital microphone system configuration shown in FIG. 2 is that for the feature extraction the audio signal with full quality is not needed, which leads to additional overhead in the digital microphone (for example the high quality ADC 108) and also in subsequent digital signal processing (for example the decimation filter 126). The additional overhead may also increase the power requirements of digital microphone system 100B in high clock rate (high performance) applications.

Figure 3:
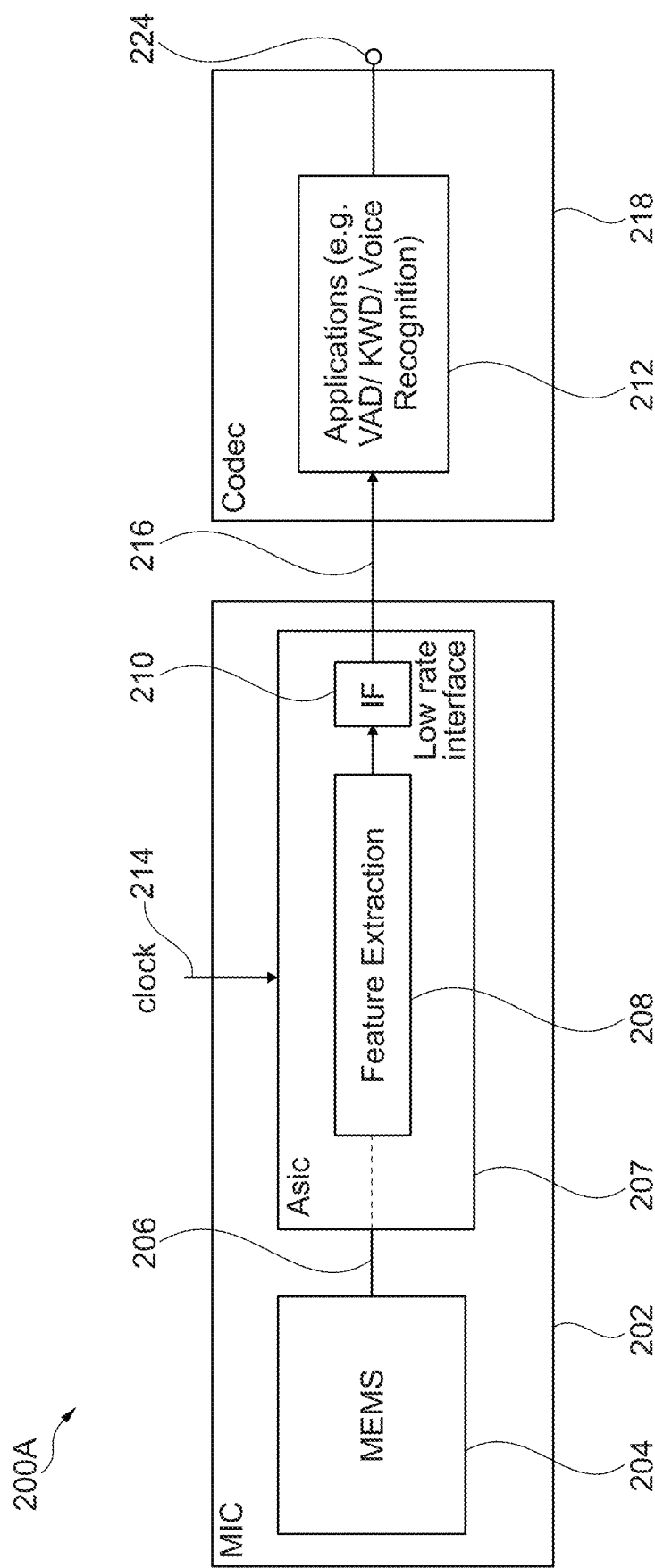
FIG. 3 is a block diagram of a digital microphone with a low data rate interface and a codec according to an embodiment.

FIG. 3 is a block diagram of a digital microphone system 200A comprising a digital microphone 202 with a low data rate interface and an audio codec 218 according to an embodiment. Digital microphone 202 includes a MEMS component such as a MEMS microphone 204, which has an analog output 206. The MEMS microphone 204 is coupled to ASIC 207. In an embodiment, ASIC 207 comprises a feature extraction component 208, which is configured to extract audio features in the analog or digital domain. The feature extraction component 208 shown in FIG. 4 can include analog, digital, or combined solutions to provide the feature extraction functionality. Specific embodiments of the feature extraction component 208 are described below. A low data rate interface component 210 is coupled between the feature extraction component 208 and the output 216 of the digital microphone 202. A specific embodiment of the low data rate interface component 210 is described below. Digital microphone 202 includes a clock input 214 for receiving a clock signal from a processor (not shown in FIG. 3). The clock signal is then distributed to the feature extraction component 208 and/or the low data rate interface 210. In an embodiment, the digital microphone system 200A includes an audio codec 218 coupled to the output 216 of digital microphone 202. Audio codec 218 is configured with one or more applications, such as a voice activity detection (VAD), keyword detection (KWD) or voice recognition and generates a corresponding digital signal at codec output 224. Audio codec 218 is described in further detail below.

"Voice Activity Detection" (VAD) as used herein, is associated with a process to detect voice or speech within an input audio or pressure signal (and might not include keyword or phrase detection). The phrase "voice activity detection" is sometimes also referred to as a "wake-on-voice" process or a "wake-on-speech" process. The phrase "Key Word Spotting ("KWS") or "Keyword Detection" (KWD) may refer to a process that detects a specific spoken word or phrase. The phrase "key word spotting" is also sometimes referred to as a voice trigger. The typical design of a VAD algorithm may include: an initial noise reduction stage, e.g. via spectral subtraction; a calculation of features or quantities from a section of the input signal; and the application of a classification rule to classify the section as speech or non-speech, wherein the classification rule is invoked when a value of the calculated feature or quantity exceeds a predetermined threshold.

Voice recognition can be used to identify a specific speaker, for example in security applications. Numerous voice recognition algorithms can be used including using Hidden Markov models, dynamic time warping (DTW)-based speech recognition, training neural networks, and "end-to-end" automatic speech recognition techniques using simplified voice models that can be used at low audio frame rates.

In embodiments, digital microphone 202 comprises one or more integrated circuits in a semiconductor package. In embodiments, the semiconductor package comprises a metal, plastic, glass, or ceramic casing comprising one or more discrete semiconductor devices or integrated circuits. Any suitable type of semiconductor package can be used. In an embodiment, MEMS microphone 204 comprises a first integrated circuit and ASIC 207 comprises a second integrated circuit coupled to the first integrated circuit. In other embodiments, a single integrated circuit comprises a common substrate including MEMS microphone 204 and ASIC 207. In embodiments, audio codec 218 is external to digital microphone 202.

According to embodiments, digital microphone system 200A shown in FIG. 3 advantageously minimizes the additional overhead of the signal processing components shown and described with respect to the exemplary digital microphone system 100A of FIG. 1A, and the exemplary digital microphone system 100B of FIG. 1B, and significantly reduces the associated power consumption. In the configuration shown in FIG. 3, the data at the output 216 of low data interface 210 are encoded with the extracted features of the voice/audio signal detected by MEMS microphone 203, whereas in the exemplary digital microphone systems described above the full digital time domain voice/audio signal is applied to the interface.

According to embodiments, all or part of the feature extraction functionality is located in the digital microphone 202 and the features are transmitted to subsequent processing circuitry. By transmitting only the detected features, the data rate at the interface can be reduced significantly leading to reduced power consumption. Data rates for various encoding techniques are described below with respect the table of FIG. 9.

Figure 4:
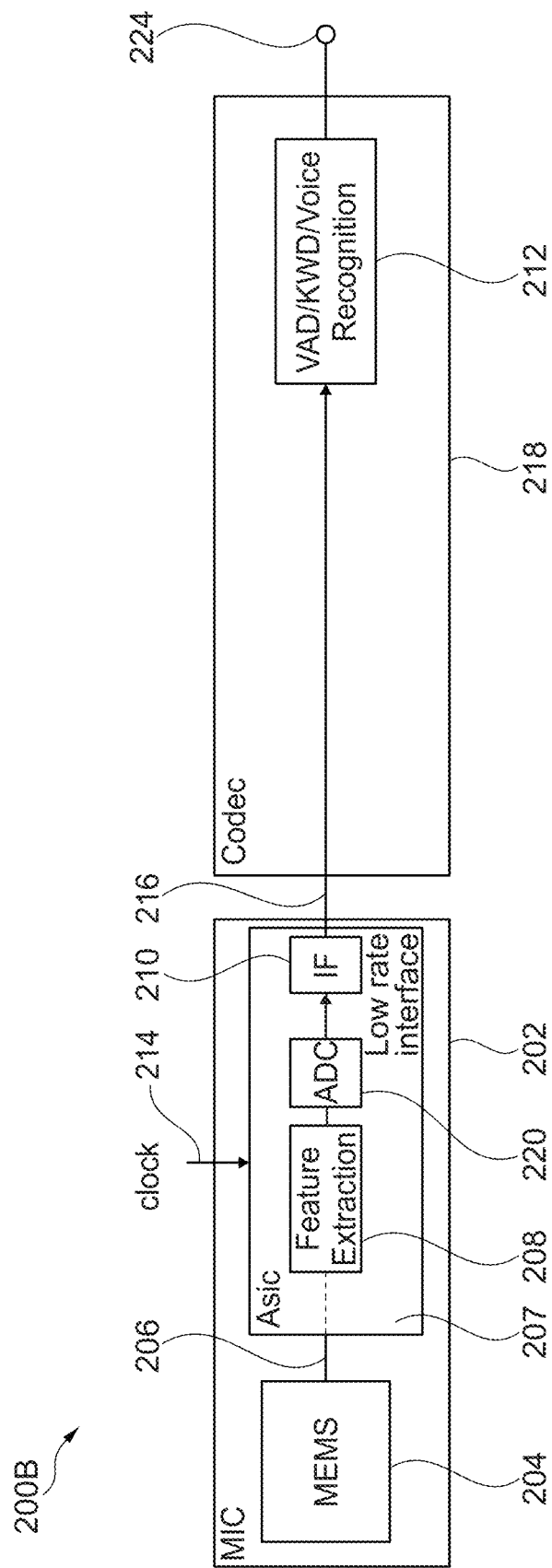
FIG. 4 is a more detailed version of the block diagram in FIG. 3, according to an embodiment.

FIG. 4 illustrates an embodiment digital microphone 200B in which feature extraction is performed in the analog domain, and thus an additional analog-to-digital converter 220 is interposed between the feature extraction component 208 and the low data rate interface 210. In the audio codec 218, the decimation filter 126 and feature extraction component 120 previously shown in FIG. 2 may now be removed from the digital signal processing chain, according to embodiments, reducing product costs and reducing power requirements.

Figure 5A:
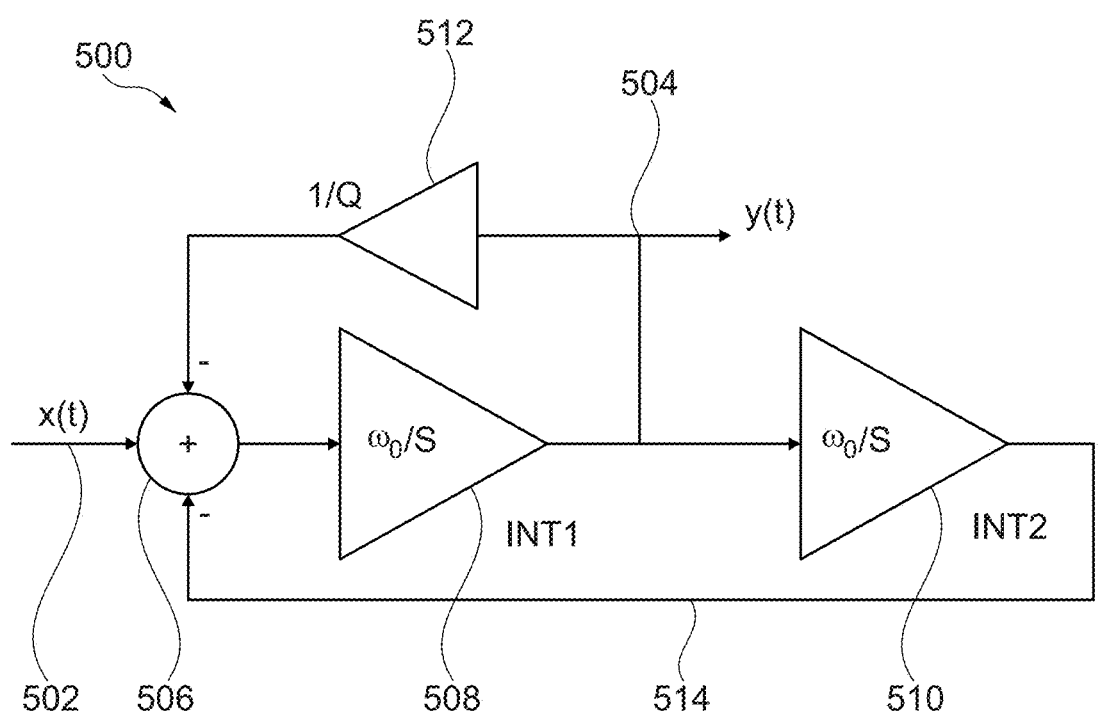
FIG. 5A is a schematic diagram of a feature extraction component including a biquad filter, according to an embodiment.

FIG. 5A is a schematic diagram of a feature extraction component including a biquad filter 500, according to an embodiment. The feature extraction component of FIG. 5A is suitable for use as the extraction component previously described above. The biquad filter 500 includes a first integrator 508 coupled to a second integrator 510. The integrators 508 and 510 both have a transfer function of $\omega_o/S$, wherein "$\omega_o$" is related to the corner frequency of the integrator and "S" is the integrating transfer function in the frequency domain. The input of the biquad filter 500 x(t) is coupled to an input 502 of a summer 506. The output of summer 506 is coupled to the input of integrator 508. The output of integrator 508 is coupled to the output node 504 of the biquad filter, y(t). The input of integrator 510 is coupled to output node 504, and the output of integrator 510 is coupled to a negative input of summer 506. The output node 504 of the biquad filter is coupled to another negative input of summer 506 through an amplifier 512. The gain of the amplifier is set to 1/Q, wherein "Q" is the quality factor of the biquad filter. Biquad filter 500 can be implemented in the analog or digital domain. If implemented in the analog domain, a digital-to-analog conversion is required for converting the analog output of biquad filter 500. However, the ADC used for the conversion can be operated with a relatively low sample rate.

The corner frequency of the integrators 508 and 510, and the gain of amplifier 512 can be adjusted as desired to extract the essential features from the analog signal present at the input node 502.

The biquad filter 500 shown in FIG. 5A can be implemented using, for example, one or more voltage-controlled oscillators (VCOs) as will be described in further detail below, particularly with respect to FIG. 6. The VCOs produce similar signals obtained from an analog filter, but encoded in the frequency of a square wave instead of in an analog voltage or analog current. In an embodiment, the output signal y(t) provided by the filter is differential, i.e. there is a square wave for the positive signal and another square wave for the negative signal. These square waves are generated in the internal VCOs of the filters as is described in further detail below. To extract the audio feature value of the input signal, an averaging circuit is used. This averaging circuit may comprise a counter counting up with the positive signal and counting down with the negative signal. The absolute value of this counter taken periodically represents the average power of the output of the filter and this can be used as the feature value. One implementation of an averaging circuit is described below with respect to FIG. 5B.

Figure 5B:
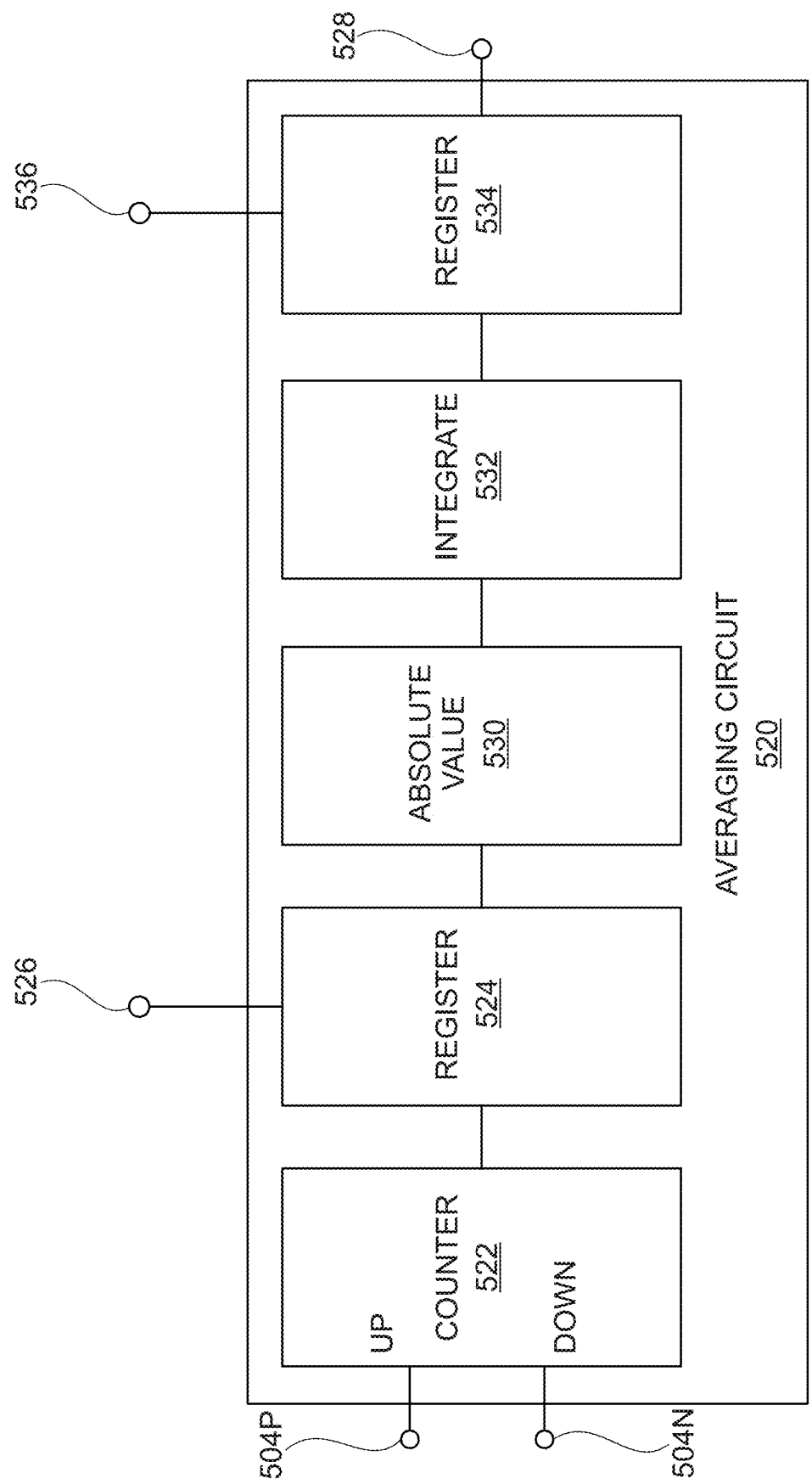
FIG. 5B is a schematic diagram of an averaging circuit for averaging the output of the feature extraction component shown in FIG. 5A, according to an embodiment.

An averaging circuit including, for example a counter and an absolute value circuit, is used to average the filtered signal at node 504, y(t), to produce the useful information for extracting the feature values. A schematic diagram of an averaging circuit 520 is shown in FIG. 5B having a counter 522 coupled to input node 502, which is the differential output nodes 504P and 504N of biquad filter 500 shown in FIG. 5A. The positive output signal node 504P is coupled to the "UP" counter input of counter 522, and the negative output signal node 504N is coupled to the "DOWN" counter input of counter 522. The counter 522 is coupled to a first register 524. Register 524 also receives a clock signal at node 526 whose frequency rate determines the update rate of the feature extraction. Register 524 is coupled to an absolute value circuit 530. In some embodiments, the absolute value may be calculated by simply stripping the sign bit of the output of register 524; other methods of determining an absolute value, however, may also be used. In alternative embodiments, other non-linear functions can be applied instead of an absolute value function, such as a squaring function. The absolute value circuit is coupled to an additional integrator circuit 532. Integrator circuit 532 can be implemented as an accumulator circuit including an arithmetic logic unit (ALU) having a first input coupled to the absolute value circuit 530, and a second input coupled to an output of the ALU. The integrator circuit is coupled to a second register 534. The output of register 534 is coupled to output node 528, which provides the output feature values. Register 534 also receives a clock signal at node 536 whose frequency rate periodically updates the output feature value at node 528. In embodiments, any suitable counters can be used for counter 522 and any suitable registers can be used for register 524 and for register 534. Other types of arrangements of the components shown in averaging circuit 520 may be used, and other types of averaging circuits may also be used.

For the feature extraction of the digital microphone described herein, several different efficient feature extraction algorithms are available. For example, the feature extraction algorithm can be based on autocorrelation coefficients. Another approach is based on a band pass filter bank, implemented with a voltage-controlled oscillator (VCO). VCO and autocorrelation coefficient feature extraction embodiments are described below with respect to FIG. 6 and FIG. 7.

Figure 6:
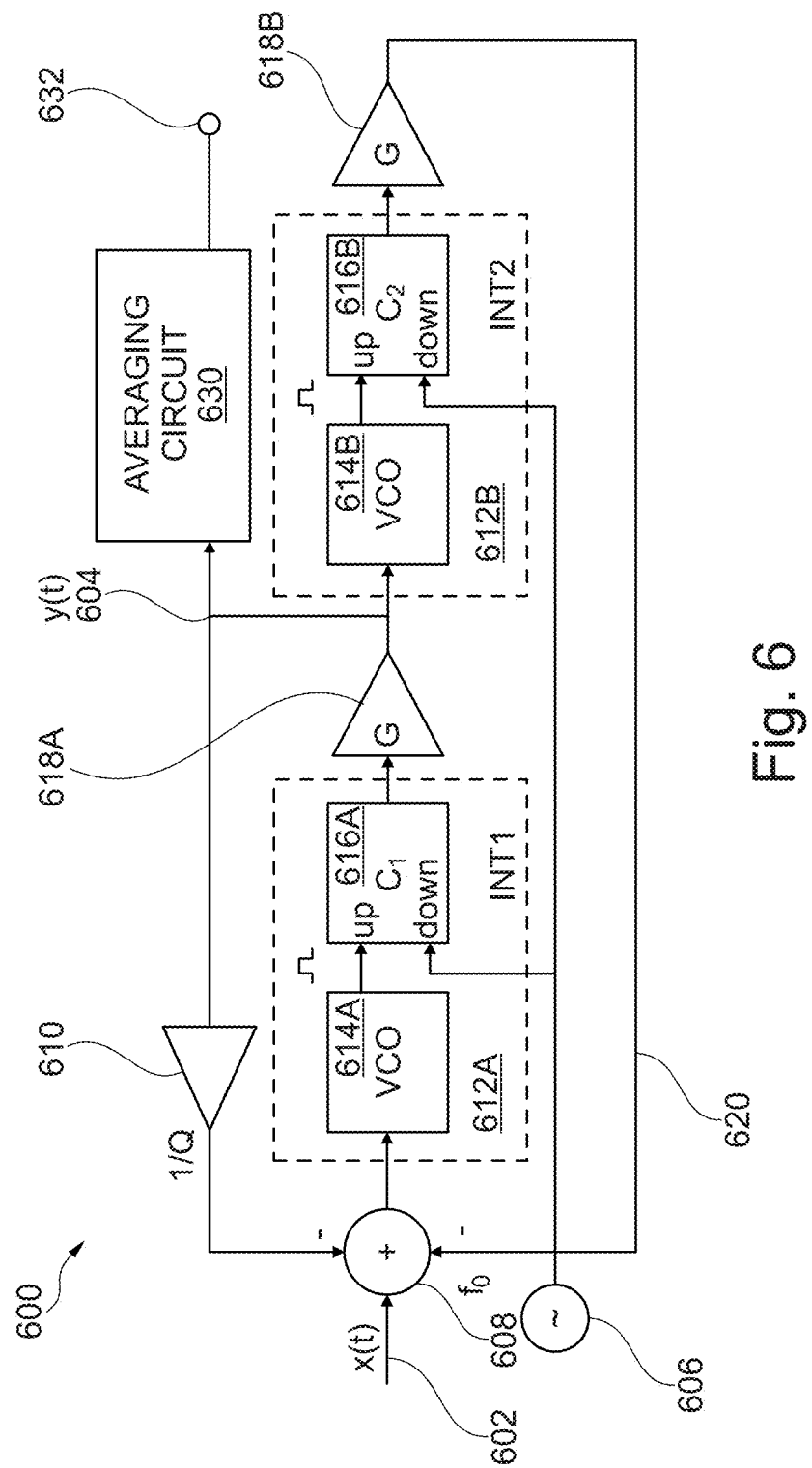
FIG. 6 is a schematic diagram of a feature extraction component including a voltage-controlled oscillator, a counter, and an averaging circuit, according an embodiment.

FIG. 6 is a schematic diagram of a feature extraction component 600 including a voltage-controlled oscillator and a counter, according an embodiment. The VCO-based feature extraction component 600 is similar in configuration to the biquad filter 500 shown in FIG. 5. In pertinent part, each of the integrators are implemented with a VCO and counter configuration that is described in further detail below. The feature extraction component 6oo includes a summer having a positive input coupled to input node 602 for receiving an analog input signal x(t). The output of summer 608 is coupled to a first integrator 612A. The output of first integrator 612A is coupled to an amplifier 618A having a gain "G". The output of amplifier 618A is coupled to output node 604 for providing a digital output, y(t). A second integrator 612B has an input coupled to output node 604 and an output coupled to an input of amplifier 618B having a gain "G". The output of amplifier 618B is coupled to a negative input of summer 608. The digital output signal y(t) is fed back to another negative input of summer 608 through amplifier 610 having a gain of 1/Q, wherein "Q" is the quality factor of the VCO-based feature extraction component 600. The digital output signal y(t) at output node 604 is coupled to the input of an averaging circuit 630, which provides the output feature values at node 632. Averaging circuit 630 can be similar to averaging circuit 520 shown in FIG. 5B in an embodiment. However, any suitable averaging circuits can also be used.

The corner frequency of the integrators 612A and 612B, and the gain of amplifiers 618A, 618B, and 61o can be adjusted as desired to extract the essential features from the analog signal present at the input node 602.

The first integrator 612A includes a first VCO 614A having an output coupled to an "up" counter input of counter 616A designated $C_1$. A "down" counter input of counter 616A receives a clock signal 606 designated "$f_o$". The output of counter 616A is coupled to the input of amplifier 618A. The second integrator 612B includes a second VCO 614B having an output coupled to an "up" counter input of counter 616B designated $C_2$. A "down" counter input of counter 616A receives the clock signal 606 designated "$f_o$". The output of counter 616B is coupled to the input of amplifier 618B.

The VCO implementation shown in FIG. 6 has an advantage of not requiring an analog to digital conversion prior to the filter bank, which operates on the frequency encoded signal (from the VCO). As a consequence, the VCO-based filters behave similar to analog band pass filters but their operation uses digital, frequency encoded signals that are processed by VCO oscillators and digital primitives.

Voice band energy is estimated in the digital domain without requiring an explicit analog-to-digital converter for power estimation, as the signal energy can be measured by counting pulses at the filter output. The ADC 220 shown in FIG. 4 is thus not required in the VCO implementation shown in FIG. 6. The mostly digital nature of the VCO implementation shown in FIG. 6 allows the use of a sub-nanometer semiconductor fabrication technology for all of the digital microphone system electronics. For example, the digital microphone 202 and the audio codec 218 shown in FIG. 3 and FIG. 4 can be integrated together on a single subnanometer integrated circuit having a common substrate. Alternatively, digital microphone 202 can be integrated on a first integrated circuit, and audio codec 218 can be integrated on a second integrated circuit coupled to the first integrated circuit.

Figure 7:
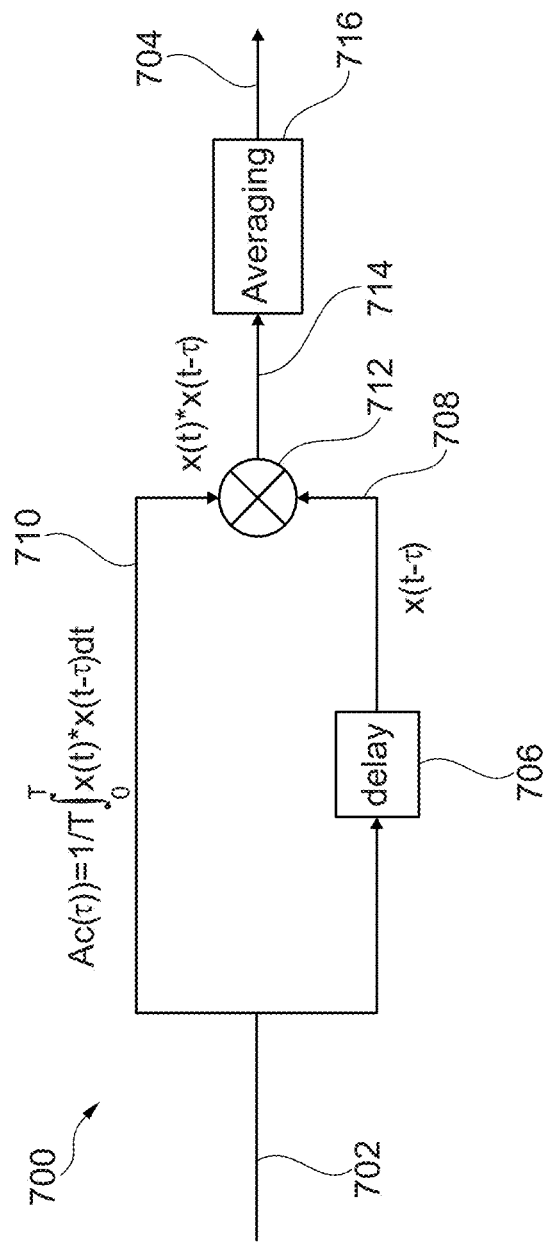
FIG. 7 is a block diagram of a feature extraction component comprising an auto-correlation component and an averaging circuit, according to an embodiment.

FIG. 7 is a block diagram of a feature extraction component 700 comprising an auto-correlation component, according to an embodiment. In general, the autocorrelation algorithm is a measure of the similarities of the analog or digital signal with a replica copy containing a time lag. In general the autocorrelation based feature extraction comprises an autocorrelation function in combination with a Fast Fourier Transformation (FFT) function. The feature extraction component 700 (without the FFT function) can be implemented in its entirety inside of the digital microphone. However, a part of the autocorrelation feature extraction component 700 could also be implemented in the audio codec, e.g. the calculation of the autocorrelation coefficients in the digital microphone as well as the FFT function.

The feature extraction component 700 includes an input node 702 for receiving an analog input signal 702. A multiplier 712 includes a first input for receiving the input signal 702, x(t). The multiplier 712 includes a second input 708 for receiving a time-delayed replica of the input signal, x(t−τ), wherein τ is the delay value. Thus, the output of multiplier 712 generates the product of the two input signals, which is equal to x(t)×x(t−τ). The output signal of multiplier 712 is averaged over a time interval T by averaging circuit 716 to generate the autocorrelation signal at output node 704. The formula for calculating the autocorrelation coefficient "Ac" is equal to 1/T×∫x(t)*x(t−τ) dt from zero to T, wherein T is the selected time interval. The autocorrelation coefficients "Ac" can be calculated in the analog or digital domain. Averaging circuit 716 can be similar to averaging circuit 520 shown in FIG. 5B. However, any suitable averaging circuit can also be used.

For every delay τ there is one autocorrelation coefficient (Ac), and the product of the input signal and the delay input signal is averaged over the time interval T. Typical numbers for autocorrelation coefficients for voice applications are 16 to 20 autocorrelation coefficients, wherein 16 to 20 delays "τi" are applied. Typically, the features in the 8 kHz range are calculated (therefore sampled with a 16 KHz clock signal) and for the calculation of the autocorrelation coefficients inter multiples of $\frac{1}{16}$ kHz are used as the delays, for example τ1=$\frac{1}{16}$ kHz, τ2=2*τ1, τ3=3*τ1, . . . , τ20=20*τ1.

Figure 8:
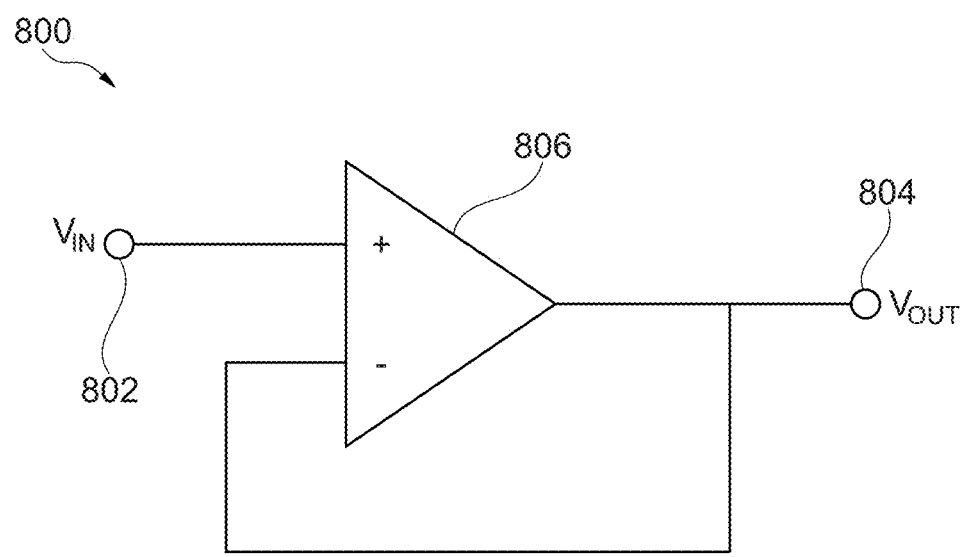
FIG. 8 is a schematic diagram of a buffer amplifier that can be used in the low data rate interface, according to an embodiment.

FIG. 8 is a schematic diagram of a buffer amplifier 800 that can be used in the low data rate interface 210 shown in FIG. 3 and FIG. 4, according to an embodiment. In an embodiment, buffer amplifier 800 includes an operational amplifier 806 having a positive input for receiving an input voltage $V_{IN}$, which is the output voltage of the feature extraction component 208 shown for example in FIG. 3 and FIG. 4. Operational amplifier 806 also has an output node 804 for generating an output voltage Vou-r that is fed back to a negative input to provide a unity gain buffer amplifier configuration. Output node 804 is coupled to the output node 216 of the digital microphone 202 shown in FIG. 3 and FIG. 4. Other types of amplifiers can be used in place of the amplifier 800 shown in FIG. 8, such as amplifiers without feedback. Other low data rate interfaces can include additional components other than a single unit gain amplifier.

FIG. 9 is a table 900 of clock rates and data rates for various microphone interfaces. In Table 900, four types of encoding schemes are shown for a digital microphone and the corresponding interface clock rate and data rate at the interface output is shown. A comparison related to the amount of data to be transmitted in each of the four types of encoding schemes is represented in Table 900. Typical digital microphones provide pulse-density modulation (PDM) data at 768 kHz (for VAD, KWD, and voice recognition applications), which is used as a reference. With pulse-code modulation (PCM) data transmission a data rate reduction of a factor of three can be achieved.

Two clock rates and two data rates are shown for two corresponding feature extraction cases are shown in table 900 for comparison with the PDM and PCM cases previously described. Two corner cases (Case 1 and Case 2) are shown in table 900. In Case 1, forty (40) features are calculated out of frames with 10 ms length and in Case 2, twenty (20) features are calculated out of frames with 20 ms length. Table 900 shows that the amount of data at the interface can be reduced significantly if features are transmitted instead of the digital audio signal, according to embodiments described herein. In Case 1, an interface clock rate of only 100 Hz (for a 16 bit interface) and a data rate of only 64 kbit per second is needed for transmitting forty features. In Case 2, an interface clock rate of only 50 Hz (for a 16 bit interface) and a data rate of only 16 kbit per second is needed for transmitting twenty features. Different clock rates will correspond to other data rates, including low data rates equal to 256 kbit per second, 192 kbit per second, 128 kbit per second, or 64 kbit per second.

Figure 10:
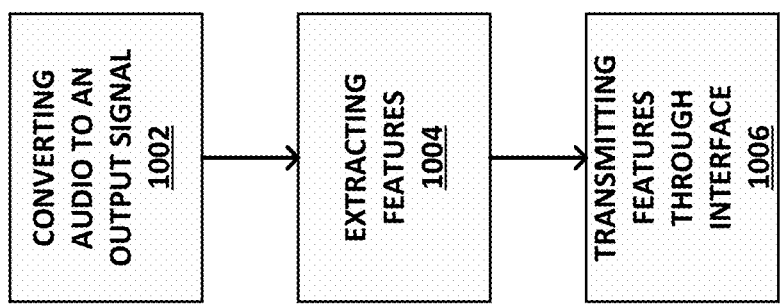
FIG. 10 is a block diagram of a low data rate method associated with a digital microphone, according to an embodiment.
Figure 10:
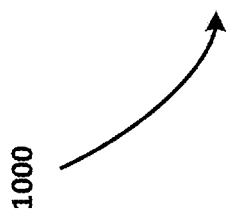

FIG. 10 is a block diagram of a low data rate method 1000 associated with a digital microphone, according to an embodiment. The low data rate method 1000 can include a conversion method comprising converting an environmental change into an output signal using a MEMS device in method step 1002; extracting a plurality of features from the output signal of the MEMS device in method step 1004; and transmitting the plurality of features through a low data rate interface, wherein a low data rate of the low data rate interface is determined by a number of the plurality of features transmitted, and wherein the conversion method is practiced by one or more integrated circuits in a single semiconductor package in method step 1006.

FIG. 11 is a block diagram of a digital microphone system 1100, according to an embodiment. Digital microphone system 1100 includes a digital microphone 1110 including a MEMS device and corresponding ASIC in a single package 1102. In an embodiment, the MEMS device can comprise an audio microphone for detecting audio signals in the audio band, generally from 20 to 20 KHz, or a pressure detector for detecting pressure signals at the lower end of the audio band or even lower frequency pressure signals. The output of MEMS device and corresponding ASIC in package 1102 is coupled to an audio codec 1104, in an embodiment. The MEMS device and corresponding ASIC in package 1102 can comprise one or more integrated circuits. In an embodiment audio codec 1104 is external to MEMS device and ASIC in package 1102. While audio codec 1104 is shown to be part of digital microphone 1110, at least part of audio codec 1104 may be included in processor 1106, in embodiments. Digital microphone system 1100 also includes a processor 1106 for providing clock signals and control signals to digital microphone 1110, and for receiving data from digital microphone 1100. In a portable embodiment, battery 1108 provides power for processor 1106 and digital microphone 1110. In embodiments, processor 1106 and digital microphone 1110 can be integrated together on a single integrated circuit, or in two separate integrated circuits. Various product configurations for the digital microphone system 1100 can be used including in cell phones, smart phones, headsets, clocks, and smart speaker product configurations, among numerous other product configurations.

Advantages of the embodiments described herein include a reduced power consumption (power savings) in the digital microphone (including power reduction due to reduced clock at the interface, and elimination of the overhead needed for high audio quality digital signal processing is not needed), a reduced frequency system clock is possible (which may be required by customers for certain applications and in certain operating modes), and reduced signal processing complexity in the subsequent digital signal processor (since no decimation filter is required, and no or a reduced amount of feature extraction is required).

In conclusion, an implementation of a digital microphone and a digital microphone system has been described herein that implements the analog input signal feature extraction (or at least a part of the feature extraction) and transmits the extracted features instead of a high quality digitally encoded audio signal. In embodiments, a MEMS device, a feature extraction component, and a low data rate interface are packaged together in a semiconductor package. At least the feature extraction component and the low data rate interface are integrated together in a single integrated circuit in an embodiment.

Example embodiments of the present invention are summarized here. Other embodiments can also be understood from the entirety of the specification and the claims filed herein.

Example 1. According to an embodiment, a MEMS system includes a MEMS device; a feature extraction component coupled to an output of the MEMS device, wherein the feature extraction component is configured to provide a plurality of features of an output signal of the MEMS device; and a low data rate interface coupled to the feature extraction components, wherein the low data rate interface is configured to transmit the plurality of features of the output signal of the MEMS device, and wherein a low data rate of the low data rate interface is determined by a number of the plurality of features transmitted, wherein the MEMS device, the feature extraction component, and the low data rate interface are packaged together in a semiconductor package.

Example 2. The MEMS system of Example 1, wherein a total power dissipation of the MEMS system is less than forty microwatts.

Example 3. The MEMS system of any of the above examples, wherein the MEMS device comprises a first integrated circuit, and the feature extraction component and the low data rate interface are integrated together on a second integrated circuit coupled to the first integrated circuit.

Example 4. The MEMS system of any of the above examples, wherein the low data rate is equal to 256 kbit per second, 192 kbit per second, 128 kbit per second, or 64 kbit per second.

Example 5. The MEMS system of any of the above examples, wherein the MEMS device comprises a microphone or a pressure sensor.

Example 6. The MEMS system of any of the above examples, wherein the feature extraction component comprises a bi-quad filter.

Example 7. The MEMS system of any of the above examples, wherein the feature extraction component comprises a voltage-controlled oscillator coupled to a counter.

Example 8. The MEMS system of any of the above examples, wherein the feature extraction component comprises an auto-correlation component.

Example 9. The MEMS system of any of the above examples, wherein the feature extraction component comprises an input for receiving a clock signal.

Example 10. The MEMS system of any of the above examples, further comprising an analog-to-digital converter interposed between the feature extraction component and the low data rate interface.

Example 11. According to an embodiment, a conversion method includes converting an environmental change into an output signal using a MEMS device; extracting a plurality of features from the output signal of the MEMS device; and transmitting the plurality of features through a low data rate interface, wherein a low data rate of the low data rate interface is determined by a number of the plurality of features transmitted, and wherein the conversion method is practiced by one or more integrated circuits in a single semiconductor package.

Example 12. The conversion method of Example 11, wherein a total power dissipation of the one or more integrated circuits is less than forty microwatts.

Example 13. The conversion method of any of the above examples, wherein the low data rate is equal to 256 kbit per second, 192 kbit per second, 128 kbit per second, or 64 kbit per second.

Example 14. The conversion method of any of the above examples, wherein extracting the plurality of features from the output signal of the MEMS device comprises filtering the output signal of the MEMS device, or determining auto-correlation features of the output signal of the MEMS device.

Example 15. The MEMS system of any of the above examples, wherein the environmental change comprises an audio wave having a frequency in the audio band, or a pressure wave having a frequency below the audio band.

Example 16. According to an embodiment, a MEMS system includes a MEMS microphone; a feature extraction component coupled to an output of the MEMS microphone, wherein the feature extraction component is configured to provide a plurality of features of an output signal of the MEMS microphone; a low data rate interface coupled to the feature extraction component, wherein the low data rate interface is configured to transmit the plurality of features of the output signal of the MEMS device, and wherein a low data rate of the low data rate interface is determined by a number of the plurality of features transmitted; and a codec coupled to the low data rate interface for digitally processing the plurality of transmitted features, wherein the MEMS microphone, the feature extraction component, and the low data rate interface are integrated together on one or more integrated circuits in a single semiconductor package.

Example 17. The MEMS system of Example 16, wherein a total power dissipation of the one or more integrated circuits is less than forty microwatts.

Example 18. The MEMS system of any of the above examples, wherein the codec is configured to provide a voice activity detection function.

Example 19. The MEMS system of any of the above examples, wherein the codec is configured to provide a keyword detection function.

Example 20. The MEMS system of any of the above examples, wherein the codec is configured to provide a voice recognition function.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A MEMS system comprising:
   a MEMS device;
   a feature extraction component coupled to an output of the MEMS device, wherein the feature extraction component is configured to provide a plurality of features of an output signal of the MEMS device, and wherein the feature extraction component comprises a first voltage-controlled oscillator coupled to a first counter; and
   a low data rate interface coupled to the feature extraction components, wherein the low data rate interface is configured to transmit the plurality of features of the output signal of the MEMS device, and wherein a low data rate of the low data rate interface is determined by a number of the plurality of features transmitted,
   wherein the MEMS device, the feature extraction component, and the low data rate interface are packaged together in a semiconductor package.

2. The MEMS system of claim 1, wherein a total power dissipation of the MEMS system is less than forty microwatts.

3. The MEMS system of claim 1, wherein the MEMS device comprises a first integrated circuit, and the feature extraction component and the low data rate interface are integrated together on a second integrated circuit coupled to the first integrated circuit.

4. The MEMS system of claim 1, wherein the low data rate is equal to 256 kbit per second, 192 kbit per second, 128 kbit per second, or 64 kbit per second.

5. The MEMS system of claim 1, wherein the MEMS device comprises a microphone or a pressure sensor.

6. The MEMS system of claim 1, further comprising an analog-to-digital converter interposed between the feature extraction component and the low data rate interface.

7. A conversion method comprising:
converting an environmental change into an output signal using a MEMS device;
extracting a plurality of features from the output signal of the MEMS device using a feature extraction component comprising a voltage-controlled oscillator coupled to a counter; and
transmitting the plurality of features through a low data rate interface, wherein a low data rate of the low data rate interface is determined by a number of the plurality of features transmitted, and wherein the conversion method is practiced by one or more integrated circuits in a single semiconductor package.

8. The conversion method of claim 7, wherein a total power dissipation of the one or more integrated circuits is less than forty microwatts.

9. The conversion method of claim 7, wherein the low data rate is equal to 256 kbit per second, 192 kbit per second, 128 kbit per second, or 64 kbit per second.

10. The conversion method of claim 7, wherein extracting the plurality of features from the output signal of the MEMS device comprises filtering the output signal of the MEMS device, or determining auto-correlation features of the output signal of the MEMS device.

11. The conversion method of claim 7, wherein the environmental change comprises an audio wave having a frequency in the audio band, or a pressure wave having a frequency below the audio band.

12. A MEMS system comprising:
a MEMS microphone;
a feature extraction component coupled to an output of the MEMS microphone, wherein the feature extraction component is configured to provide a plurality of features of an output signal of the MEMS microphone using a feature extraction component comprising a voltage-controlled oscillator coupled to a counter;
a low data rate interface coupled to the feature extraction component, wherein the low data rate interface is configured to transmit the plurality of features of the output signal of the MEMS device, and wherein a low data rate of the low data rate interface is determined by a number of the plurality of features transmitted; and
a codec coupled to the low data rate interface for digitally processing the plurality of transmitted features,
wherein the MEMS microphone, the feature extraction component, and the low data rate interface are integrated together on one or more integrated circuits in a single semiconductor package.

13. The MEMS system of claim 12, wherein a total power dissipation of the one or more integrated circuits is less than forty microwatts.

14. The MEMS system of claim 12, wherein the codec is configured to provide a voice activity detection function.

15. The MEMS system of claim 12, wherein the codec is configured to provide a keyword detection function.

16. The MEMS system of claim 12, wherein the codec is configured to provide a voice recognition function.

17. The MEMS system of claim 1, wherein the first counter is coupled to a first amplifier.

18. The MEMS system of claim 1, wherein the feature extraction component comprises a second voltage-controlled oscillator coupled to a second counter.

19. The MEMS system of claim 18, wherein the second counter is coupled to a second amplifier.

20. The MEMS system of claim 1, wherein the first voltage-controlled oscillator and the first counter are configured in a negative feedback loop.

* * * * *